United States Patent [19]

Morimoto

[11] 4,120,700
[45] Oct. 17, 1978

[54] METHOD OF PRODUCING P-N JUNCTION TYPE ELEMENTS BY IONIZED CLUSTER BEAM DEPOSITION AND ION-IMPLANTATION

[75] Inventor: Kiyoshi Morimoto, Mobara, Japan

[73] Assignee: Futaba Denshi Kogyo Kabushiki Kaisha, Japan

[21] Appl. No.: 755,066

[22] Filed: Dec. 28, 1976

[30] Foreign Application Priority Data

Dec. 30, 1975 [JP] Japan ................. 50-156808

[51] Int. Cl.² ............... H01L 21/265; H01L 7/54
[52] U.S. Cl. ................. 148/1.5; 148/175; 357/20; 357/91
[58] Field of Search .......... 250/492 A, 492 B; 357/20, 91; 148/1.5, 175

[56] References Cited

U.S. PATENT DOCUMENTS

| 3,433,677 | 3/1969 | Robinson | 136/89 R |
| 3,520,741 | 7/1970 | Mankarious | 148/175 |
| 3,551,213 | 12/1970 | Boyle | 148/1.5 |
| 3,908,183 | 9/1975 | Ennis, Jr. | 357/65 |
| 3,912,826 | 10/1975 | Kennedy | 427/8 |
| 4,066,527 | 1/1978 | Takagi et al. | 204/192 |

FOREIGN PATENT DOCUMENTS 4,823,599  7/1973  Japan .......................... B26/F

OTHER PUBLICATIONS

T. Takagi et al., "Ionized Cluster Beam Deposition", in Ion Implantation in Semiconductors, ed. S. Namba, Plenum; New York, 1974, p. 341.

Primary Examiner—L. Dewayne Rutledge
Assistant Examiner—Upendra Roy
Attorney, Agent, or Firm—Oblon, Fisher, Spivak, McClelland & Maier

[57] ABSTRACT

A p-n junction type solid-state element having a substrate, a substrate electrode coated on the substrate, a p-n junction type semiconductor layer coated on the substrate having the substrate electrode thereon, and an upper terminal electrode coated on the p-n junction type semiconductor layer; in which the p-n junction type semiconductor layer is formd by coating an n-type (or p-type) semiconductor layer on the substrate having the substrate electrode thereon by the ion-plating method and then by forming a p-type (or n-type) semiconductor layer in the upper surface region of the n-type (or p-type) seminconductor layer by the ion-implantation method.

4 Claims, 4 Drawing Figures

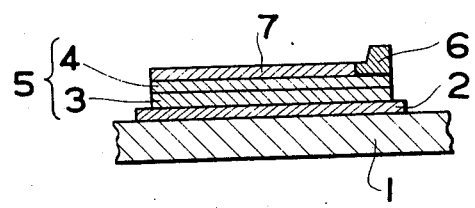
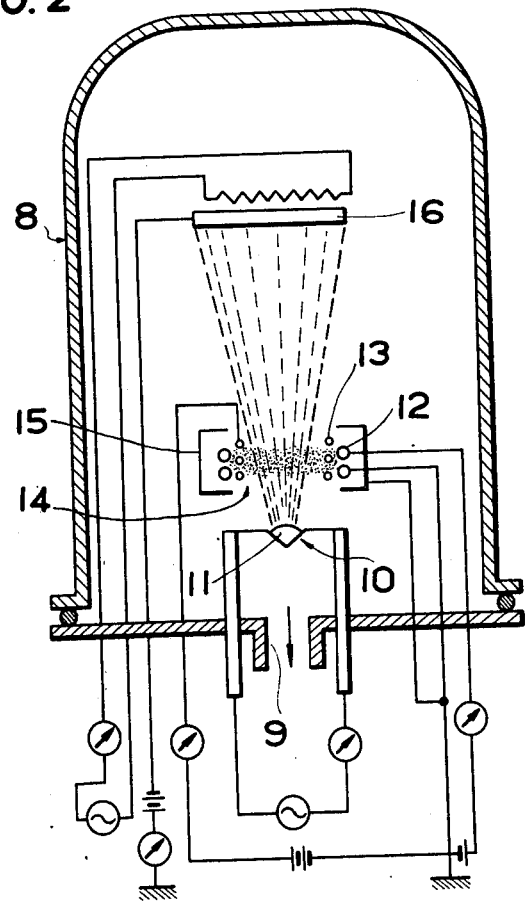

METHOD OF PRODUCING P-N JUNCTION TYPE ELEMENTS BY IONIZED CLUSTER BEAM DEPOSITION AND ION-IMPLANTATION

BACKGROUND OF THE INVENTION

The present invention relates to a p-n junction type solid-state element for use in a filmy solar battery or the like, and a method of producing the same.

Heretofore, a solid-state element having a p-n junction type semiconductor suitable for use in a solar battery or the like usually has been produced by lapping or polishing a single crystal bulk of, for instance, silicon and thus it has been very difficult to produce a thin film having a thickness on the order of microns. Even if such a thin film can be produced after much difficulty, the amount of the material that can be utilized will be as low as several present of the total at best. Moreover, it is said to be impossible to produce a high-quality crystalline film by the conventional evaporation or sputtering method.

On the other hand, there has been an increasing demand for a solid-state element for use in a solar battery or the like, which is filmy, light in weight and easy to handle and has a high-quality p-n junction type semiconductor strongly bonded to the substrate and terminal electrodes.

SUMMARY OF THE INVENTION

It is an object of the present invention to provide a high-quality p-n junction type solid-state element which can meet the above-mentioned requirements.

It is another object of the present invention to provide a method of producing the above-mentioned high-quality p-n junction type solid-state element.

According to the present invention, the p-n junction type solid-state element has in a laminated manner a substrate, s substrate electrode provided at least on a part of the substrate and formed of a metal film, a p-n junction type semiconductor layer coated on the substrate having the substrate electrode thereon, the metal film of the substrate electrode being such as can produce an ohmic contact with the p-n junction type semiconductor layer, and an upper terminal electrode coated at least on a part of the upper surface of the semiconductor layer and formed of a metal film such as can produce an ohmic contact with the semiconductor layer. At least the n-type (or p-type) semiconductor of the p-n junction type semiconductor layer in contact with the substrate electrode is coated on the substrate electrode by the so-called ion-plating method which vaporizes materials of the semiconductor to form a vapor, bombards the vapor with electrons to ionize at least a part of the vapor, and accelerates the ionized vapor by an electric field to make it impinge on the upper surface of the substrate electrode. The p-type (or n-type) semiconductor of the p-n junction type semiconductor in contact with the upper terminal electrode is formed by ionizing impurity atoms necessary for forming the p-type (or n-type) semiconductor by an ionization device to form impurity ions, and accelerating the impurity ions by giving kinetic energy thereto to implant them into the surface region of the layer of the n-type (or p-type) semiconductor coated on the upper surface of the substrate electrode.

BRIEF DESCRIPTION OF THE DRAWING

FIG. 1 is an explanatory sectional side view of an example of the p-n junction type solid-state element according to the present invention, showing the essential part thereof;

FIG. 2 is a schematical sectional view of an ion-plating device, showing the principle thereof; the ion-plating device being used for performing the high-vacuum ion-plating method which is an example of the ion-plating method applied to a stage of the process for producing the p-n junction type solid-state element according to the present invention;

DETAILED DESCRIPTION OF THE INVENTION

Figure 3:
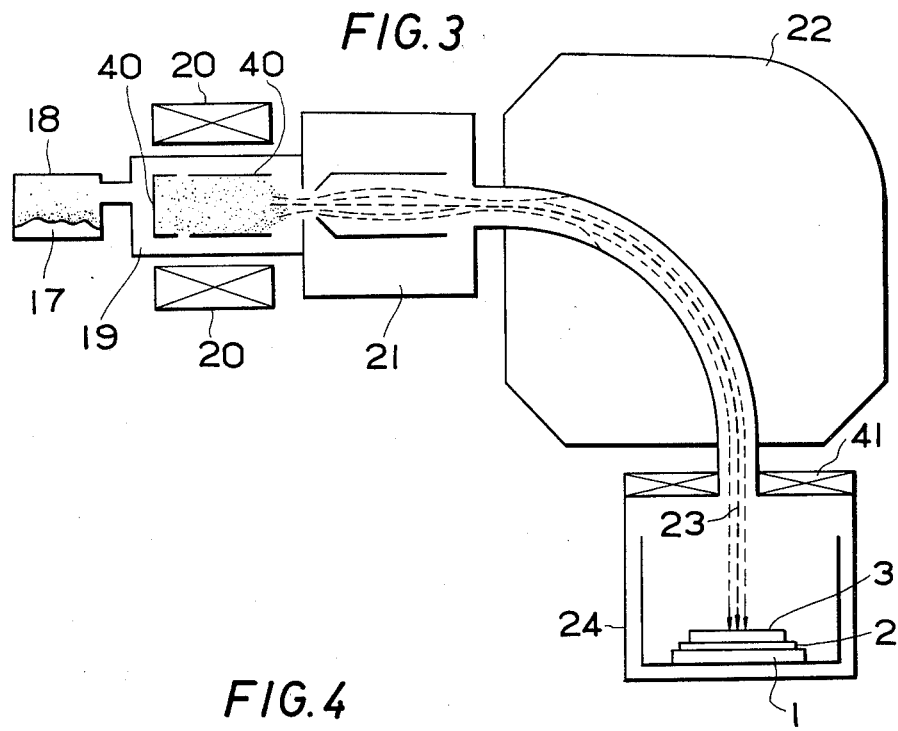
FIG. 3 is a schematical principal view of an ion-implanting device for performing the ion-implantation method applied to a stage of the process for producing the element of the present invention.

Now the present invention will be hereinafter described in detail with reference to the accompanying drawings.

Description will be first made on the p-n junction type solid-state element of the present invention with reference to FIG. 1 which shows an example of the p-n junction type solid-state element according to the present invention.

Reference numeral 1 designates a substrate formed of an organic film made of polymide, Mylar or the like, or formed of an inorganic sheet made of glass or the like, or formed of a metal sheet made of aluminum, copper, nickel or the like. A substrate electrode 2 is formed at least on a part of the upper surface of the substrate 1. The substrate electrode 2 is formed of a metal film coated on the substrate 1 in a laminated manner. The metal film is such as can produce an ohmic contact with a semiconductor to be subsequently coated thereon. At least a p-n junction type semiconductor layer 5 is formed on the upper surface of the substrate electrode 2. The p-n junction type semiconductor layer 5 consists of a substrate-electrode-side semiconductor film 3 made of p-type (or n-type) semiconductor coated on the substrate electrode 2 and an upper-terminal-electrode-side semiconductor film 4 made of n-type (or p-type) semiconductor and formed on the semiconductor film 3 in a laminated manner. At least on a part of the upper surface of the semiconductor layer 5, there is provided an upper terminal electrode 6 formed of a metal film such as can produce an ohmic contact with the semiconductor film 4 adjacent to the upside terminal electrode 6. Reference numeral 7 designates a reflection-preventing layer coated on the portion of the upper surface of the semiconductor layer 5 where the upper terminal electrode 6 is not formed.

The substrate-electrode-side semiconductor film 3 forming a part of the p-n junction type semiconductor layer 5 is formed by the so-called ion-plating method which vaporizes the material of the semiconductor film 3 in a vacuum region, bombards the vaporized material with electrons to ionize at least a part thereof, and accelerates the vaporized and ionized material in an electric field to make it impinge on and coat on the upper surface of the substrate 1 having the substrate electrode 2 thereon.

The upper-terminal-electrode-side semiconductor film 4 forming another part of the p-n junction type semiconductor is formed in the upper region of the substrate-electrode-side semiconductor 3 by the so-called ion-implantation method which vaporizes and ionizes, in an ion source, impurity atoms such as can give the transistor film 3 by a conductivity of the type opposite to that it has, and accelerates the vaporized and ionized atoms in an intense electric field to make them impinge on the surface of the semiconductor film 3 thereby implanting them into the semiconductor film 3.

When the semiconductor film 3 is of n-type silicon, the semiconductor film 4 is formed by implanting boron or the like into the film 3 using the ion-implantation method; and when the semiconductor film 3 is of p-type silicon, phosphorus or the like is implanted in the same manner to form the film 4. In order to produce a high-quality crystalline layer, it is desirable to make the semiconductor film 3 "$2\mu$ to 10 $\mu$" thick and the semiconductor film 4 "0.2 $\mu$ to several microns" thick.

Proper heat treatments during or after the ion-plating process and after the ion-implantation process can favorably affect the crystal growth and the adhesion between layers.

The substrate electrode 2 and upper terminal electrode 6 are, as mentioned above, formed of metal sheets such as can produce an ohmic contact with adjoining semiconductors. Such metal sheets are preferably made of aluminum, indium or the like when the adjoining semiconductor is p-type silicon, and antimony or the like or its alloys when the adjoining semiconductor is n-type silicon.

The substrate 1 used for the above-mentioned p-n junction type solid-state element may be formed of an organic sheet or organic flexible film made of Mylar, polyimide or the like, or an inorganic sheet made of glass, ceramics or the like, or a metal sheet. According to the purpose, use, etc. of the p-n junction type solid-state element, a suitable one can be selected from among the above-mentioned.

As mentioned above, the substrate-electrode-side semicondcutor film 3 of the p-n junction type semiconductor layer 5 is deposited and formed on the substrate 1 by the ion-plating method. In this process, the spatter-cleaning action of ions appears on the coating surface during deposition, and thereof the semiconductor film 3 laminated on the substrate 1 becomes very strong and very high in adhesive strength. In addition, the upper-terminal-electrode-side semiconductor film 4 is formed by the ion-implantation method as mentioned above, and therefore it can have a junction very sharply defined and well controlled in concentration and thus it becomes extremely high in quality. These features make the filmy solid-state element of the present invention most suitable for use in a solar battery.

In the foregoing embodiment, the p-n junction type solid-state element can be made flexible, if the substrate 1 is formed of a flexible film. The flexible element may be folded up or rolled up in a small size for storage, etc. As a result, it is easy to handle, store, transport, etc.

Also in the above-mentioned embodiment, a multi-junction type solid-state element can be produced by providing a substantially transparent electrode and a plurality of laminated semiconductor layers. In addition, it is possible to produce a p-n junction type solar battery which receives light from the side of the substrate 1, by making the substrate 1 transparent and the substrate electrode 2 transparent or coated on a part of the substrate 1.

The reflection-preventing layer 7 is coated on the upper surface of the p-n junction type solid-state element so as to effectively absorb external light incident thereon. It may be formed by the ion-plating method used in the present invention or by other suitable methods. Instead of providing an independent reflection-preventing layer, the upper terminal electrode 6 may be so formed that it can perform the reflection-preventing function additionally.

Next, the method of producing the p-n junction type solid-state element according to the present invention will be hereinafter described in detail.

The method of producing the p-n junction type solid-state element according to the present invention includes a substrate-electrode-forming step for coating at least a part of the substrate 1 with the substrate electrode 2 formed of a metal film such as can produce an ohmic contact with a semiconductor to be subsequently coated thereon, a p-n junction type semiconductor layer forming step for coating the upper surface of the substrate electrode 2 with the p-n junction type semiconductor layer 5, and an upper-terminal-electrode forming step for coating at least a part of the upper surface of the p-n junction type semiconductor layer 5 with the upper terminal electrode 6 formed of a metal film such as can produce an ohmic contact with the semiconductor layer 5. In addition, the above-mentioned p-n junction type semiconductor layer forming step includes the sub-step of forming an n-type (or p-type) semiconductor film on the substrate electrode 2 by the so-called ion-plating method which vaporizes the material of the semiconductor film, bombards the vaporized material with electrons to ionize at least a part thereof, and accelerates the vaporized and ionized material in an electric field to make it impinge on the upper surface of the substrate electrode thereby forming the semiconductor film thereon, and the sub-step of forming an upper semiconductor layer in the p-type (or n-type) semiconductor film, said upper semiconductor layer forming a p-n junction in cooperation with the p-type (or n-type) semiconductor film, by the ion implantation method which vaporizes by heating or the like a substrate consisting of impurity elements such as can produce a conductivity of the type opposite to that of the above-mentioned semiconductor film, or its compounds such as chlorides and bromides, produces ions of the substance in a high-frequency discharge type ion source device which gives a high-frequency electric field to the vaporized substance, accelerates the ions of the vaporized substance by giving them kinetic energies in an acceleration electric field, etc., separates ions of the impurity atoms through a mass separater if necessary, and makes the ions of the impurity atoms impinge on the n-type (or p-type) semiconductor film thereby implanting the ions thereinto. If necessary, added is the step of forming the reflection-preventing layer 7 on the portion of the upper surface of the semiconductor layer 5 where the terminal electrode 6 is not formed.

Next, as an example of the ion-plating method used in this invention, the high-vacuum ion-plating method will be hereinafter described with reference to FIG. 2 which is a schematical principle view of a device for performing the high-vacuum ion-plating method.

In FIG. 2, the reference numeral 8 designates a bell jar having a bottom opening 9 connected to an exhaust system. The bell jar 8 is evacuated through the bottom opening 9 and is maintained at a high vacuum of $10^{-2}$ Torr or less. A crucible 10 is placed in the bell jar 8 and contains an evaporation substance 11 (corresponding to the material of the above-mentioned semiconductor film 3 in this case). When the crucible 10 is electrically heated, the evaporation substance 11 is vaporized. A filament 12 for emitting thermions for ionization provided in the bell jar 8 emits thermions, when electrically energized, and thereby an electric current 14 is caused to flow from the filament 12 to an anode 13 provided in the bell jar 8. When the vaporized atoms of the evaporation substances 11 come flying into the electric current 14, at least a part thereof are ionized by electron bombardment. Ions thus produced are accelerated by an electric field provided between the filament 12, a shield 15 disposed around the filament 12, and a substrate 16 (corresponding to the above-mentioned substrate 1 with the substrate electrode 2 thereon). Thus the ions obtain a large kinetic energy and impinge on the surface of the substrate 16. In this case, non-ionized neutral atoms also reach the substrate 16 while being caught in the ion current. Thus both the ions and neutral atoms are deposited on the surface of the substrate 16 thereby forming a crystalline layer (corresponding to the semiconductor film 3) thereon.

Next, the ion-implantation method used in this invention will be hereinafter described in detail with reference to FIG. 3 which is a schematical principle view of an example of the ion-implantation device.

Material 17 consisting of elements and/or compounds thereof to be implanted (corresponding to the substance containing impurity atoms such as can form the semiconductor layer 4) is placed in an evaporation chamber 18. The evaporation chamber 18 is heated by a suitable means to vaporize the material 17. Vaporized atoms of the material 17 are fed into an ionization chamber 19, where the atoms are ionized under the influence of an external high-frequency electric field produced by a coil 20 surrounding the chamber 19 and an electric discharge produced by electrodes 40 provided in the chamber 19. Ions 31 thus produced are taken out of the chamber 19 by a taking-out acceleration electrode section 21, where the ions 31 are accelerated and made to converge. Then the ions 31 are fed into a mass separator 22, where necessary ions 23 are separated from the ions 31. Then the separated ions 23 are fed into the ion-implantation chamber 24, where the ions 23 are made to impinge on the upper layer of the semiconductor film 3 on the substrate electrode 2 formed on the substrate 1 placed on the bottom of the chamber 24, thereby forming the semiconductor layer 4 on which the upper terminal electrode 6 is to be mounted. Numeral 41 designates a scanning device provided in the vicinity of the outlet of the mass separator 22 if required. The scanning device 41 produces a magnetic field for making the ions 23 uniformly scann or diverge on a wider area of the upper surface of the semiconductor film 3 so that the ions 23 may properly impinge on the upper layer of the semicondcutor film 3 thereby to be implanted thereinto.

In the above embodiment, the ion-implantation device uses an ion source device of the so-called high-frequency discharge type which utilizes discharge in the air. However, the ion source device is not limited to this type. It may be of the electron bombardment type, electron oscillation type, various plasma types, surface ionization type, etc., as a matter of course.

Also in the above embodiment, the ion-implantation device is shown as provided with the mass separator 22. However, it is not necessary to provide such a mass separator if the ions of impurity elements produced in the ion source device and extracted therefrom are high in purity, as a matter of course.

Next, the cluster ion beam deposition method (hereinafter referred to as the cluster deposition method) which is an example of the ion-plating method used in this invention will be described with reference to FIG. 4 which is a schematical principle view of a device for performing the cluster deposition method.

Figure 4:
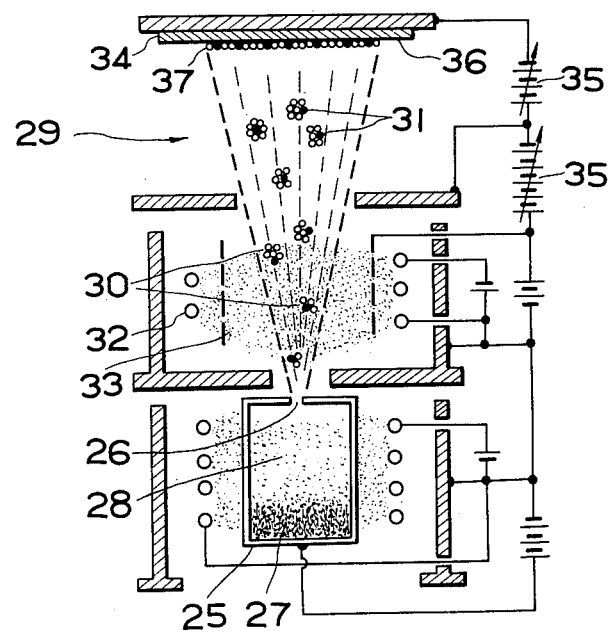
FIG. 4 is a schematical principle view of an evaporation device for performing the cluster deposition method which is another example of the ion-plating method applied to a stage of the process for producing the element of the present invention.

In FIG. 4, the reference numeral 25 is a closed type crucible having at least an injection nozzle 26. It contains therein materials 27 of a substance to be evaporated (corresponding to the materials of the semiconductor film 3 to be deposited on the substrate electrode 2). The crucible 25 is heated to a high temperature by a suitable heating method such as resistance heating or electron bombardment heating (as shown) to vaporize the materials 27 so as to produce a vapor 28 having a vapor pressure of about $10^{-2}$ to several Torr. The vapor 28 is jetted through the nozzle 26 into a vacuum region 29 having a vacuum 1/100 or less of the vapor pressure of the vapor 28 in the crucible 25 and, in addition, a pressure of about $10^{-2}$ Torr or less. Thus, massive atom groups 30 known as clusters are produced under the super-cooling phenomenon caused by adiabatic expansion of the vapor 28. Each cluster usually consists of about 100 to 200 atoms. If one of the atoms forming the cluster 30 is ionized, the cluster 30 becomes a cluster ion 31. Accordingly, a filament 32 is provided as a thermion emission source. When energized, the filament 32 emits electrons, which are made to impinge on the clusters 30 thereby forming the cluster ions 31. The cluster ions 31, together with the neutral clusters 30, advance flying toward a substrate 34 (corresponding to the substrate 1 with the substrate electrode 2 thereon) while accelerated under the influence of an electric field produced by an acceleration power source connected to the substrate 34 or its vicinities. Thus these clusters 30 and 31 are made to impinge on the surface 36 of the substrate 34 thereby forming a film layer 37 thereon (corresponding to the semiconductor film 3 on the substrate electrode 2 formed on the substrate 1). In this case, the surface 36 of the substrate 34 is at all times kept clean, since the spatter-cleaning action is incessantly at work thereon due to the cluster ions 31 impinging thereon. As a result, a film layer very high in adhesive strength can be deposited on the substrate 34 in a very clean circumstance. Besides, since the charge-mass ratio "$e/m$" is very small, this method can achieve deposition of high-quality film layers excellent in adhesive strength and purity on various insulating substrates such as organic films, which has been almost impossible in the case of the conventional methods.

In the above-mentioned process of the present invention to which the ion-plating method such as high vacuum ion-plating method or cluster deposition method is applied, the working conditions such as substrate temperature, intensity of ionization electron current, and ion acceleration voltage may be properly selected according to the substrate material, surface condition and material of each layer to be deposited, etc., so as to optimize the quality, strength, adhesive strength, etc. of each deposited layer.

In the above-mentioned method of producing a p-n junction type solid-state element according to the present invention, the above-mentioned ion-plating method such as high-vacuum ion-plating method or cluster deposition method may be applied to at least one of the steps of forming the substrate electrode and the upper terminal electrode, besides the above-mentioned step of forming the semiconductor film.

In this way, the method of the present invention can produce more efficiently a p-n junction type solid-state element much higher in quality which meets the desired requirements for thickness, etc. and is suitable for use in a solar battery.

According to the present invention, a multi-junction type solid-state element having a plurality of p-n junction type semiconductor layers 5 may be produced by repeatedly performing the necessary steps of the above-mentioned method.

As mentioned above, the essential requirements of the p-n junction type solid-state element and its production method according to the present invention include formation of a semiconductor film layer performed by the ion-plating method such as high-vacuum ion-plating method or cluster deposition method and formation of an upper terminal electrode performed by the ion-implantation method. Accordingly, the structure and production method of the solid-state element according to the present invention are highly suitable for the production of a solar battery.

Various features and effects of the present invention are summarized as follows:

(1) In the ion-plating method such as cluster deposition method or high-vacuum ion-plating method, deposition is carried out under the condition in which the spatter-cleaning action caused by ions or cluster ions appears on the surface to be deposited. Therefore, a film layer excellent in strength and adhesive strength can be produced not only on a substrate made of glass or the like, but also on an organic substrate made of Mylar, polyimide or the like even it is filmy and flexible. Thus, the solid-state element according to the present invention can extremely widen its range of use.

(2) The thickness of the substrate-electrode-side semiconductor layer or upper-terminal-electrode-side semiconductor layer to be deposited on the substrate can be controlled by properly adjusting the working conditions of the ion-plating process and ion-implantation process. Therefore, the portion of the semiconductor layer between its upper surface and the p-n junction layer can be decreased in thickness and, as a result, the element produced can have a wide wavelength sensitivity range to incident rays of light.

(3) In order to form a p-n junction by the conventional method, impurities are thermally diffused into a semiconductor from the surface thereof. Therefore, a high concentration diffusion region prevails in the vicinity of the surface. Since the recombination of holes and electrons frequently occurs in this region, charged particles produced by irradiation cannot be effectively taken out.

Meanwhile, according to the present invention, the concentration of impurities can be controlled during deposition and, in addition, a very sharply defined junction layer can be formed. Accordingly, the above-mentioned disadvantage of the prior art can be greatly improved.

(4) According to the present invention, the so-called multi-junction type solid-state element can be produced by laminating a plurality of p-n junction type semiconductor layers. Thus, the element of the present invention can be greatly improved in efficiency.

(5) According to the present invention, the semiconductor that can be used is not limited to silicon. Other element or compound semiconductors, such as GaP, GaAs, InP and CdTe may be used, as a matter of course.

When a compound semiconductor layer is to be formed, it is not necessarily required to place the semiconductor itself in the closed type crucible. In other words, component elements of the semiconductor suitably mixed may be placed therein. This is one of the excellent advantages of the present invention.

(6) According to the present invention, a flexible p-n junction type solid-state element, almost impossible to produce by the prior art, can be produced by depositing a filmy semiconductor layer extremely high in strength and quality on a flexible organic film. Such an element can achieve saving of materials, weight reduction owing to its decreased thickness, etc. In addition, since it is small and flexible, it can be folded or rolled up in compact form for convenience of storage, handling, transportation, etc. Moreover, there is not the possibility of quality deterioration even when it is folded or rolled up.

(7) According to the present invention, the upper semiconductor layer adjoining the upper terminal electrode is formed by the ion-implantation method which selects only the necessary ions for deposition, and therefore it is very high in quality. Thus the p-n junction type solid-state element can have a structure most desirable for use in a solar battery and able to be produced most efficiently.

What is claimed is:

1. A method of producing a p-n junction type solid-state element comprising the steps of:
   providing a substrate;
   forming a substrate electrode on at least a part of the upper surface of the substrate;
   vaporizing a semiconductor material of one impurity type in a vacuum region to form a vapor of said material;
   bombarding the vapor with electrons to ionize at least a part thereof;
   accelerating the ionized vapor in an electric field to cause the vapor to impinge on the substrate electrode to form an ion-plated semiconductor layer of the one impurity type on the substrate, the substrate electrode being formed of a metal film such as can produce an ohmic contact with the semiconductor layer of the one impurity type;
   ionizing impurity atoms such as can form a semiconductor layer having the type of conductivity opposite to that of the semiconductor layer of the one impurity type;
   accelerating the impurity ions by giving them kinetic energies;
   implanting the impurity ions in the semiconductor layer of the one impurity type to form an ion-implanted semiconductor layer of the other impurity type; and
   forming an upper terminal electrode on at least a part of the upper surface of the semiconductor layer of the other impurity type, the upper terminal electrode being formed of a metal film such as can produce an ohmic contact with the semiconductor layer of the other impurity type.

2. A method of producing a p-n junction type solid-state element comprising the steps of:
provide a substrate;
forming a substrate electrode on at least a part of the upper surface of the substrate;
vaporizing a semiconductor material of one impurity type in a vacuum region to form a vapor of said material;
jetting the vapor into a vacuum region of about $10^{-2}$ Torr or less to form clusters;
bombarding the clusters with electrons to ionize at least a part thereof;
accelerating the ionized clusters in an electric field to cause the clusters to impinge on the substrate electrode to form a cluster ion beam deposited semiconductor layer of the one impurity type on the substrate, the substrate electrode being formed of a metal film such as can produce an ohmic contact with the semiconductor layer of the one impurity type;
ionizing impurity atoms such as can form a semiconductor layer having the type of conductivity opposite to that of the semiconductor layer of the one impurity type;
accelerating the impurity ions by giving them kinetic energies;
implanting the impurity ions in the semiconductor layer of the one impurity type to form an ion-implanted semiconductor layer of the other impurity type; and
forming an upper terminal electrode on at least a part of the upper surface of the semiconductor layer of the other impurity type, the upper terminal electrode being formed of a metal film such as can produce an ohmic contact with the semiconductor layer of the other impurity type.

3. A method of producing a p-n junction type solid-state element comprising the steps of:
providing a substrate;
vaporizing a metal in a vacuum region to form a vapor of said metal;
bombarding the vapor with electrons to ionize at least a part thereof;
accelerating the ionized vapor in an electric field to cause the vapor to impinge on the substrate to form an ion-plated substrate electrode on at least a part of the upper surface of the substrate;
vaporizing a semiconductor material of one impurity type in a vacuum region to form a vapor of said semiconductor material;
bombarding the vapor of said semiconductor material with electrons to ionize at least a part thereof;
accelerating the ionized vapor of said semiconductor material in an electric field to cause the vapor of said semiconductor material to impinge on the substrate electrode to form an ion-plated semiconductor layer of the one impurity type on the substrate, the substrate electrode being formed of a metal film such as can produce an ohmic contact with the semiconductor layer of the one impurity type;
ionizing impurity atoms such as can form a semiconductor layer having the type of conductivity opposite to that of the semiconductor layer of the one impurity type;
accelerating the impurity ions by giving them kinetic energies;
implanting the impurity ions in the semiconductor layer of the one impurity type to form an ion-implanted semiconductor layer of the other impurity type; and
forming an upper terminal electrode on at least a part of the upper surface of the semiconductor layer of the other impurity type, the upper terminal electrode being formed of a metal film such as can produce an ohmic contact with the semiconductor layer of the other impurity type.

4. A method of producing a p-n junction type solid-state element comprising the steps of:
providing a substrate;
forming a substrate electrode on at least a part of the upper surface of the substrate;
vaporizing a semiconductor material of one impurity type in a vacuum region to form a vapor of said material;
bombarding the vapor with electrons to ionize at least a part thereof;
accelerating the ionized vapor in an electric field to cause the vapor to impinge on the substrate electrode to form an ion-plated semiconductor layer of the one impurity type on the substrate, the substrate electrode being formed of a metal film such as can produce an ohmic contact with the semiconductor layer of the one impurity type;
ionizing impurity atoms such as can form a semiconductor layer having the type of conductivity opposite to that of the semiconductor layer of the one impurity type;
accelerating the impurity ions by giving them kinetic energies;
implanting the impurity ions in the semiconductor layer of the one impurity type to form an ion-implanted semiconductor layer of the other impurity type;
vaporizing a metal in a vacuum region to form a vapor of said metal;
bombarding the vapor of said metal with electrons to ionize at least a part thereof;
accelerating the ionized vapor of said metal in an electric field to cause the vapor of said metal to impinge on the semiconductor layer of the other impurity type to form an ion-plated upper terminal electrode on at least a part of the upper surface of the semiconductor layer of the other impurity type, the upper terminal electrode being formed of a metal film such as can produce an ohmic contact with the semiconductor layer of the other impurity type.

* * * * *